United States Patent [19]
Noto et al.

[11] Patent Number: 5,739,553
[45] Date of Patent: Apr. 14, 1998

[54] ALGAINP LIGHT-EMITTING DEVICE

[75] Inventors: Nobuhiko Noto; Keizo Adomi; Takao Takenaka, all of Gunma-ken, Japan

[73] Assignee: Shin-Etsu Handotai, Co., Ltd., Tokyo, Japan

[21] Appl. No.: 577,961

[22] Filed: Dec. 26, 1995

[51] Int. Cl.⁶ .................................................. H01L 33/00
[52] U.S. Cl. ............................ 257/94; 257/97; 257/103; 372/46
[58] Field of Search ............................ 257/94, 96, 97, 257/103; 372/46

[56] References Cited

U.S. PATENT DOCUMENTS

| | | | |
|---|---|---|---|
| 5,008,718 | 4/1991 | Fletcher et al. | 357/17 |
| 5,442,203 | 8/1995 | Adomi et al. | 257/97 |
| 5,444,269 | 8/1995 | Adomiet et al. | 257/94 |
| 5,488,235 | 1/1996 | Nozaki et al. | 257/94 |

FOREIGN PATENT DOCUMENTS

| | | |
|---|---|---|
| 0 616 377 A2 | 9/1994 | European Pat. Off. |
| 0 627 772 A2 | 12/1994 | European Pat. Off. |

*Primary Examiner*—Sara W. Crane
*Attorney, Agent, or Firm*—Barnes & Thornburg

[57] ABSTRACT

The present invention provides an AlGaInP light-emitting device with a longer life and higher reliability. The AlGaInP light-emitting device comprises an n-type $(Al_{0.7}Ga_{0.3})_{0.51}In_{0.49}P$ cladding layer (about 1 μm in thickness), an $(Al_{0.15}Ga_{0.85})_{0.51}In_{0.49}P$ active layer (about 0.6 μm in thickness), a p-type $(Al_{0.7}Ga_{0.3})_{0.51}In_{0.49}P$ cladding layer (about 1 μm in thickness), and a p-type current-spreading layer composed of either a p-type $Al_{0.7}Ga_{0.3}As$ layer (about 3 μm in thickness) or a p-type $Al_{0.7}Ga_{0.3}As_{0.97}P_{0.03}$ layer (about 3 μm in thickness) and a p-type $GaAs_{0.5}P_{0.5}$ layer (about 7 μm in thickness), in sequence formed on an n-type GaAs substrate, and further an upper surface electrode mounted on the p-type $GaAs_{0.5}P_{0.5}$ layer and a lower surface electrode mounted on the lower surface of the n-type GaAs substrate.

16 Claims, 3 Drawing Sheets

ALGAINP LIGHT-EMITTING DEVICE

BACKGROUND OF THE INVENTION

1. Field of the Invention

The present invention relates to a semiconductor light-emitting device using compound semiconductor and more particularly, relates to the semiconductor light-emitting device with an active layer composed of an AlGaInP.

2. Related Prior Art

An AlGaInP material has the largest energy band gap of direct-transition type among III–V group compound semiconductor mixed crystals except nitrides of III group elements. A light-emitting device composed of an AlGaInP material with such a large energy band gap of direct type is able to make light emission with high luminance at a wavelength in the range of 550 nm to 650 nm (a range of green to red) and has for that reason recently been expanding its application mainly to outdoor displays.

FIG. 4 is a schematic sectional view illustrating an example of the conventional AlGaInP light-emitting device. This conventional AlGaInP light emitting device 30 has a structure comprising a first conductivity-type $(Al_xGa_{1-x})_{0.51}In_{0.49}P$ cladding layer 12 (about 1 μm in thickness), an $(Al_yGa_{1-y})_{0.51}In_{0.49}P$ active layer 13 (about 0.6 μm in thickness), a second conductivity-type $(Al_zGa_{1-z})_{0.51}In_{0.49}P$ cladding layer 14 (about 1 μm in thickness), and a second conductivity-type current-spreading layer 35 (a few μm or more in thickness), respectively in the above sequential order formed on a first conductivity-type GaAs substrate 11, an upper surface electrode 16 formed on the second conductivity-type current-spreading layer 35, and a lower surface electrode 17 on the lower surface of the GaAs substrate 11.

In this device the double-heterojunction structure composed of the $(Al_yGa_{1-y})_{0.51}In_{0.49}P$ active layer 13 and the two AlGaInP cladding layers wider in energy band gap than that of the active layer 13, that is, the first conductivity-type $(Al_xGa_{1-x})_{0.51}In_{0.49}P$ cladding layer 12 and the second conductivity-type $(Al_zGa_{1-z})_{0.51}In_{0.49}P$ cladding layer 14, form the light-emitting-layer region 18. The x, y and z of Al compositions of the respective AlGaInP layers composing the above double-heterojunction structure satisfy relations of $0 \leq y \leq 0.7$, y<x and y<z. The $(Al_yGa_{1-y})_{0.51}In_{0.49}P$ active layer 13 functions as a light emitting layer.

In the mean time, as far as special circumstances do not arise, an $(Al_BGa_{1-B})_{0.51}In_{0.49}P$ or simply AlGaInP is generally used to represent each of the above-mentioned $(Al_xGa_{1-x})_{0.51}In_{0.49}P$, $(Al_yGa_{1-y})_{0.51}In_{0.49}P$ and $(Al_zGa_{1-z})_{0.51}In_{0.49}P$ in the following description.

In an AlGaInP light-emitting device as described above, a current-spreading layer is required on the light-emitting region 18, where it is necessary to specially use a material other than the AlGaInP as that of the current-spreading layer. The reason will be explained in reference to FIG. 4. The state of distribution of current flowing in from the upper electrode 16 is indicated by a reference numeral 19 in FIG. 4.

In light emission of an AlGaInP light-emitting device under passage of current, it is desired that the flow of current from the upper surface electrode 16 effectively spreads throughout all the light-emitting region 18, particularly, throughout all the AlGaInP active layer 13 and light-emission is thereby efficiently made. It is required, for that reason, that the distance between the upper surface electrode 16 and the AlGaInP active layer 13 is set to be a certain magnitude of several μm or larger.

An AlGaInP light-emitting device is usually composed of the AlGaInP layers, as shown in FIG. 4, a layer 12 (about 1 μm in thickness), a layer 13 (about 0.6 μm in thickness), and a layer 14 (about 1 μm in thickness), and all of which are in a composition of a $(Al_BGa_{1-B})_{0.51}In_{0.49}P$ formed being matched in lattice on a GaAs substrate 11, whereas it is very difficult to form the $(Al_BGa_{1-B})_{0.51}In_{0.49}P$ layers to a total thickness in excess of 4 μm with no disturbance in crystallinity. In this circumstance, the growth of the layer of this thickness is close to impossible with a material of the AlGaInP due to the above-mentioned reason, although the distance between the upper surface electrode 16 and the active layer 13 is required to be several μm or more in order to effectively spread the flow of current from an upper surface electrode 16 throughout all the active layer 13.

Consequently, a layer or layers other than the material of the AlGaInP has been used to form the current-spreading layer 35 on a light-emitting region 18 so that the current flow from an upper surface electrode 16 is effectively dispersed throughout all an active layer 13, resulting that the light emission is efficiently made.

As a material of the current-spreading layer 35, an $Al_wGa_{1-w}As$ ($0.45 \leq w<1$, usually w≈0.7) or a GaP whose energy band gap of direct-transition type is larger than the energy of a photon: $E^{\Gamma}_g$ has been used.

When the above-mentioned $Al_wGa_{1-w}As$ or GaP is used as a material for a current-spreading layer, however, both materials have problems, which will be described below.

First, a description will be made about the current-spreading layer of the $Al_wGa_{1-w}As$.

In order that light emission at an AlGaInP active layer 13 is not absorbed in the $Al_wGa_{1-w}As$ current-spreading layer 35, the $Al_wGa_{1-w}As$ with a high concentration of Al is usually used, in which an AlAs mixed-crystal ratio w is high (for example, w≈, or is nearly equal to, 0.7). When an AlGaInP light-emitting device 20 is used outdoors in a continuous mode and an $Al_wGa_{1-w}As$ with a high concentration of Al is used as a current-spreading layer 35 of the device, because the $Al_wGa_{1-w}As$ is very liable to oxidation due to high concentration of Al, reduction of luminance by light emission and further breakdown of the device are unavoidable problems induced by the oxidation of the $Al_wGa_{1-w}As$ current-spreading layer 35.

Since the lattice-mismatching ratio between an $Al_wGa_{1-w}As$ and an $(Al_BGa_{1-B})_{0.51}In_{0.49}P$ is very small and about 0.1%, there is an advantage that a good crystalline interface between an $(Al_zGa_{1-z})_{0.51}In_{0.49}P$ cladding layer 14 and the $Al_wGa_{1-w}As$ current-spreading layer 35 formed on the cladding layer 14 is produced and also the $Al_wGa_{1-w}As$ current-spreading layer is obtained with a good crystallinity.

Second, a GaP current-spreading layer will be described below. Since the lattice-mismatching ratio between a GaP and an $(Al_BGa_{1-B})_{0.51}In_{0.49}P$ is very high and about 4%, it is extremely difficult to grow a crystal of a GaP on an $(Al_zGa_{1-z})_{0.51}In_{0.49}P$ cladding layer 14. What's more, there arise not only dislocations having a density of as high as about $1 \times 10^{12}$ cm$^{-2}$ at the interface between the aforementioned cladding layer 14 and a GaP current-spreading layer 35 formed on the cladding layer 14, but also internal stresses locally in the interface. These dislocations and internal stresses unfavorably exert their influence upon a light-emitting region 18, particularly, upon as far as an AlGaInP active layer 13, which bears a main role of light emission.

For this reason, in the operation of this AlGaInP light-emitting device under current passage, there is a problem that deterioration of device characteristics in time-course, in particular, reduction of luminance by light emission in time-course occurs. A GaP has, of course, an advantage that it does not have such a problem as the afore-mentioned $Al_wGa_{1-w}As$ having a high concentration of Al does.

SUMMARY OF THE INVENTION

In light of the above problems, it is an object of the present invention to provide an AlGaInP light-emitting device with a longer life and a higher reliability which has a good matching in lattice to an $(Al_BGa_{1-B})_{0.51}In_{0.49}P$ composing a light-emitting region and comprises a current-spreading layer which is hard to be subjected to oxidation and characteristics concerning light emission of which is not deteriorated even in lengthy operation of current passage.

To solve the problem above mentioned, a first aspect of the present invention is here provided, which is an AlGaInP light-emitting device comprising a light-emitting region composed of an AlGaInP double-heterojunction structure formed on a GaAs substrate and a current-spreading layer further formed on the light-emitting region, characterized in that the current-spreading layer composes two layers of an $Al_wGa_{1-w}As$ layer and a $GaAs_{1-v}P_v$ layer formed on the $Al_wGa_{1-w}As$ layer both of which have energy band gaps $E^\Gamma_g$ of direct-transition type larger than the energy of a photon emitted from an $(Al_yGa_{1-y})_{0.51}In_{0.49}P$ active layer in the light-emitting region.

It is preferable that an Al composition y of the $(Al_yGa_{1-y})_{0.51}In_{0.49}P$ active layer is a value that satisfies a relation of $0 \leq y \leq 0.7$, an AlAs mixed-crystal ratio w of the $Al_wGa_{1-w}As$ and a GaP mixed-crystal ratio v of the $GaAs_{1-v}P_v$ are values that respectively satisfy relations of $0.45 \leq w < 1$ and $0.4 \leq v < 0.8$.

The total thickness of the current-spreading layer, which is the sum of the thickness of the $Al_wGa_{1-w}As$ layer and the thickness of the $GaAs_{1-v}P_v$ layer, is required to be 5 μm or more in order to maintain the crystallinity of the light-emitting region and to secure proper dispersion of the flow of a current. With a larger total thickness of the current-spreading layer, an external emission efficiency becomes larger.

Since the lattice constant of an $Al_wGa_{1-w}As$ is very close to that of an $(Al_B Ga_{1-B})_{0.51}In_{0.49}P$ which is grown by being matched in lattice on a GaAs substrate, a good crystalline interface is formed between an AlGaInP light-emitting region and the $Al_wGa_{1-w}As$ layer grown on the light-emitting region, and also the $Al_wGa_{1-w}As$ with a good crystallinity is obtained.

The Lattice constant of a $GaAs_{1-v}P_v$ is changeable together with a change in the mixed-crystal ratio v. For example, when a $GaAs_{0.5}P_{0.5}$ layer is formed on the $Al_wGa_{1-w}As$ layer, the mismatching-in-lattice ratio between an $Al_wGa_{1-w}As$ and a $GaAs_{0.5}P_{0.5}$ is about 2% and a GaAsP layer with a less dislocation density can be grown than when a GaP is directly grown as a current-spreading layer. Besides, in a current-spreading layer having a double structure according to the first aspect of the present invention, since the interface where dislocations occur is that between the $Al_wGa_{1-w}As$ and the $GaAs_{1-v}P_v$, the interface is remoter from the light-emitting region by the thickness of the $Al_wGa_{1-w}As$ layer and therefore the dislocations occurring in the interface is the harder in exerting the influence upon the light-emitting region. Under such a condition, good crystallinity of the light-emitting region can be maintained.

In addition, since $GaAs_{1-v}P_v$ is very hard in oxidation similar to GaP, the $GaAs_{1-v}P_v$ layer has an effect that it works as a protecting film against oxidation of the $Al_wGa_{1-w}As$ layer.

Further, to solve the problem, the second aspect of the present invention is here provided, which is an AlGaInP light-emitting device comprising a light-emitting region composed of an AlGaInP double-heterojunction structure formed on a GaAs substrate and a current-spreading layer formed on the light-emitting region, characterized in that the current-spreading layer comprises two layers of an $Al_wGa_{1-w}As_{1-u}P_u$ layer and a $GaAs_{1-v}P_v$ layer formed on the $Al_wGa_{1-w}As_{1-u}P_u$ layer both of which have energy band gaps $E^\Gamma_g$ of direct-transition type larger than the energy of a photon emitted from an $(Al_yGa_{1-y})_{0.51}In_{0.49}P$ active layer in the light-emitting region.

It is preferable that an Al composition y in the afore-mentioned $(Al_yGa_{1-y})_{0.51}In_{0.49}P$ active layer is a value that satisfies a relation of $0 \leq y \leq 0.7$, an Al composition w and P composition u of the $Al_wGa_{1-w}As_{1-u}P_u$ and a GaP mixed-crystal ratio v of the $GaAs_{1-v}P_v$ are values that respectively satisfy relations of $0.45 \leq w < 1$, $0 < u \leq 0.08$, and $0.4 \leq v < 0.8$.

The total thickness of the current-spreading layer, which is the sum of the thicknesses of a $Al_wGa_{1-w}As_{1-u}P_u$ layer and a $GaAs_{1-v}P_v$ layer, is required to be 5 μm or more in order to maintain the crystallinity of the light-emitting region and to secure proper dispersion of the flow of a current. With a larger total thickness of the current-spreading layer, the external emission efficiency becomes larger.

Since the lattice constant of an $Al_wGa_{1-w}As_{1-u}P_u$ layer, whose compositions respectively satisfy the relations of $0.45 \leq w < 1$, $0 < u \leq 0.08$, is very close to that of an $(Al_BGa_{1-B})_{0.51}In_{0.49}P$ grown by being matched in lattice on a GaAs substrate, a good crystalline interface is formed between an AlGaInP light-emitting region and the $Al_wGa_{1-w}As_{1-u}P_u$ layer grown on the light-emitting region, and also the $Al_wGa_{1-w}As_{1-u}P_u$ layer with a good crystallinity is obtained.

$Al_wGa_{1-w}As_{1-u}P_u$ can be perfectly matched in lattice by controlling an Al composition w and P composition u, for example, $Al_{0.7}Ga_{0.3}As_{0.97}P_{0.03}$, to $(Al_BGa_{1-B})_{0.51}In_{0.49}P$ at room temperature and thus the internal stresses caused by a degree of mismatching in lattice between an $(Al_BGa_{1-B})_{0.51}In_{0.49}P$ layer and an $Al_wGa_{1-w}As_{1-u}P_u$ layer can be reduced to zero.

The lattice constant of $GaAs_{1-v}P_v$ whose composition satisfy a relation of $0.4 \leq v < 0.8$ changes following to a change in the mixed-crystal ratio v of its own. For example, when a $GaAs_{0.5}P_{0.5}$ layer is formed on the $Al_wGa_{1-w}As_{1-u}P_u$ layer, the mismatching-in-lattice ratio therebetween is about 2% and thus a GaAsP layer with a less dislocation density can be grown, compared with the case that a GaP is directly grown as a current-spreading layer.

Besides, in a current-spreading layer having a double structure according to the second aspect of the present invention, since the interface where dislocations occur is that between the $Al_wGa_{1-w}As_{1-u}P_u$ layer and the $GaAs_{1-v}P_v$ layer, the interface is remoter from the light-emitting region by the thickness of the $Al_wGa_{1-w}As_{1-u}P_u$ layer, therefore the dislocations occurring in the interface has difficulty in exerting the influence over the light-emitting region, so that the good crystallinity of the light-emitting region can be maintained.

In addition, since $GaAs_{1-v}P_v$ is very hard in oxidation similar to GaP, a $GaAs_{1-v}P_v$ layer has an effect to protect a $Al_wGa_{1-w}As_{1-u}P_u$ layer against oxidation as a protecting film.

BRIEF DESCRIPTION OF THE DRAWINGS

The novel features which are considered characteristic of the present invention are set forth with particularity in the appended claims. The present invention itself, however, and additional objects and advantages thereof will best be understood from the following description of embodiments thereof when read in connection with the accompanying drawings, in which:

DETAILED DESCRIPTION OF THE INVENTION

EXAMPLE 1

Below, description will be given about an AlGaInP light-emitting device according to the first aspect of the present invention in reference to FIGS. 1 and 3.

Chemical formulae, elements, configuration of layers, thicknesses of layers, and relative positions thereof are shown for the purpose of illustration only and not intended as a definition of the limits of the present invention, as far as otherwise specialized.

The respective layers of AlGaInP light-emitting devices of the example and comparative examples are grown by an MOVPE method (a metal-organic vapor phase epitaxy method). As raw materials for Al, Ga, In, P, and As, trimethyl aluminum: $Al(CH_3)_3$ or TMAl, trimethyl gallium: $Ga(CH_3)_3$ or TMGa, trimethyl Indium: $In(CH_3)_3$ or TMIn, phosphine: $PH_3$, and arsine: $AsH_3$ are respectively used. In addition, as dopant sources, hydrogen selenide: $H_2Se$, dimethyl zinc: $Zn(CH_3)_2$ or DMZn are used.

Figure 3:
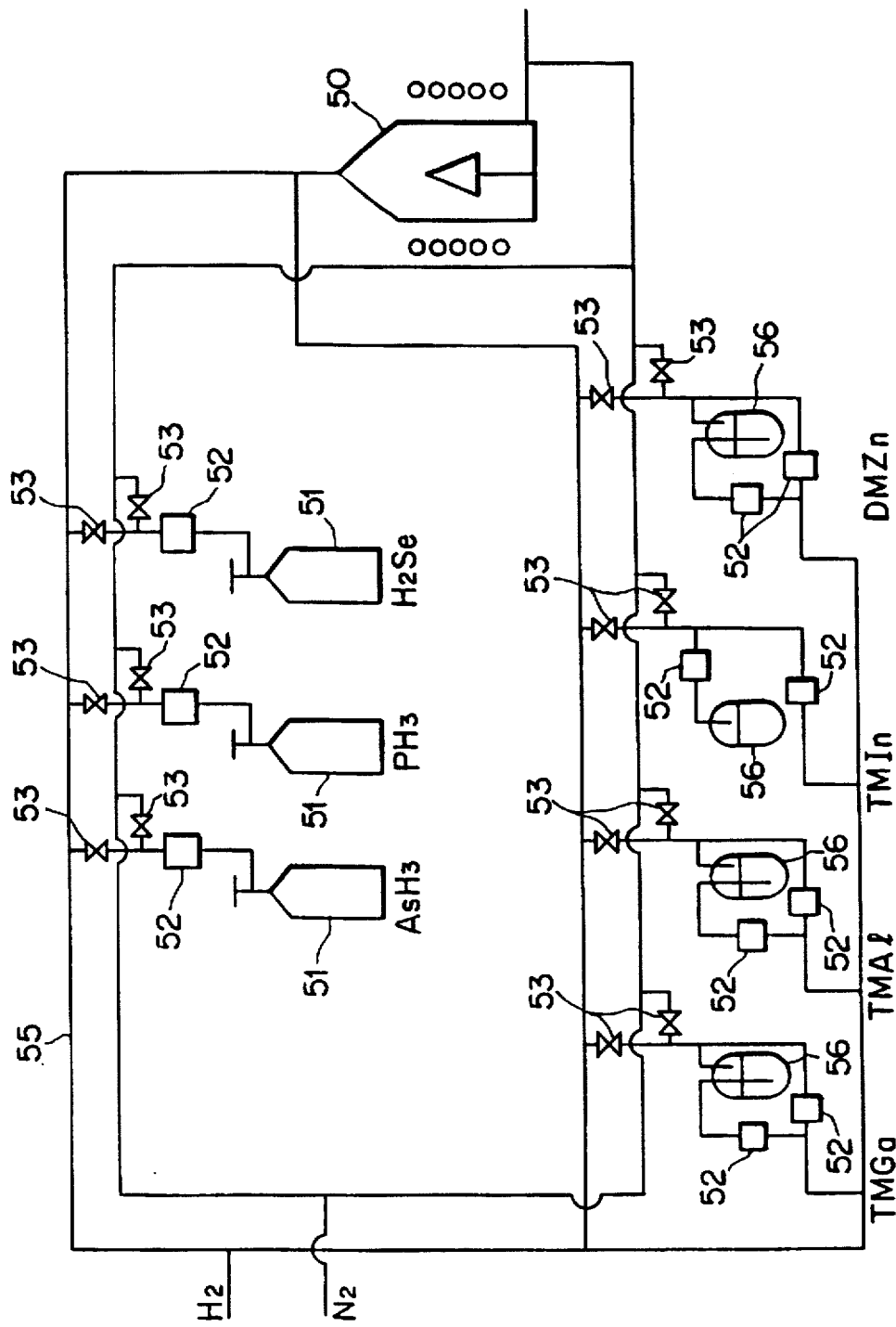
FIG. 3 is a schematic view showing an example of the apparatus used for growing respective layers by a MOVPE method.

FIG. 3 shows an example of the configuration of a growth apparatus used for growing respective layers by a MOVPE method. In the figure, vapors of various kinds of III-group metal-organic compounds and hydrides of V-group elements in a vapor phase are mixed by adjusting individual partial pressures and flow rates thereof in dependence on the respective compositions of layers to be grown, each of the thus prepared gaseous mixtures is supplied into a reaction chamber 50, and desired growth layers are formed in sequence on an n-type or p-type GaAs substrate(s) disposed in the reaction chamber 50.

In the figure, 51 indicates gas cylinders storing hydrides in vapor phase such as phosphine $PH_3$ and arsine $AsH_3$ and the hydrides are supplied into a gas channel 55 for a carrier gas such as hydrogen by way of pressure flow regulators 52 and control valves 53 from the gas cylinders 51. 56 indicates bubbling baths producing vapors of metal-organic compounds such as trimethyl aluminum TMAl, trimethyl gallium TMGa, trimethyl indium TMIn and the like. The metal-organic compound vapors produced by bubbling of hydrogen gas which are regulated of a pressure and flow rate thereof by the pressure flow regulators 52 are supplied into the carrier gas channel 55 for hydrogen and the like by way of the control valves 53.

Thereafter, the afore-mentioned vapors of III-group metal-organic compounds and V-group element hydrides are mixed by means of the gas channel 55 to form respective given mixture gases by adjusting partial pressures and flow rates of each of the vapors or gases in dependence on each of the layer compositions to be grown and each of the thus prepared mixture gases is further supplied into the reaction chamber 50 surrounded by a heating mean(s) whose temperature and pressure are respectively adjusted at given magnitudes to thereby form desired growth layers in sequence on an n-type or p-type substrate(s) disposed in the reaction chamber 50.

In concrete terms, the individual layers of an AlGaInP light-emitting device are in sequence formed on a GaAs substrate, with the use of mixture gases, as raw material gases for growth of layers, prepared in such a manner that the supply ratio of a V-group element(s) to a III-group element(s) (V/III ratio) is 100, under conditions of a reduced pressure of 50 torr, a growth temperature of 710° C., and a growth speed of 4 µm/hour.

Thus obtained epitaxial wafer(s) is transformed into AlGaInP light-emitting devices through a fabrication process therefor.

An AlGaInP light-emitting device 10 of the example 1 was produced by the method of production above mentioned.

Figure 1:
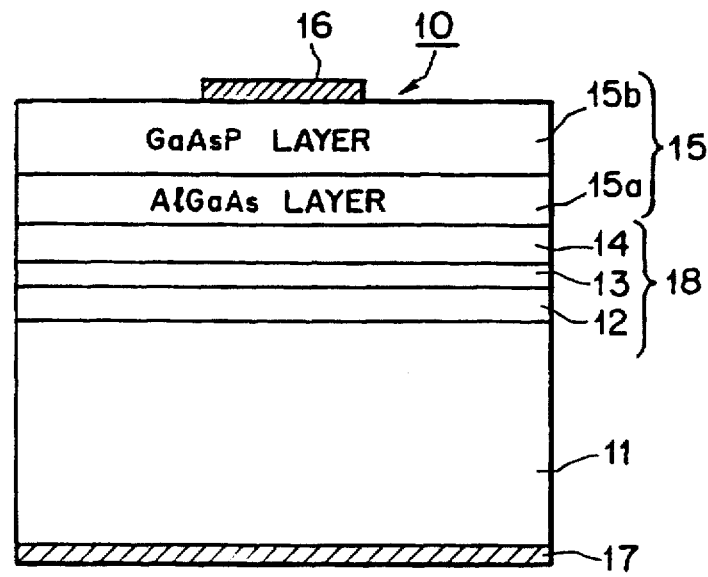
FIG. 1 is a schematic sectional view illustrating an example of the AlGaInP light-emitting device according to a first aspect of the present invention.
Figure 4:
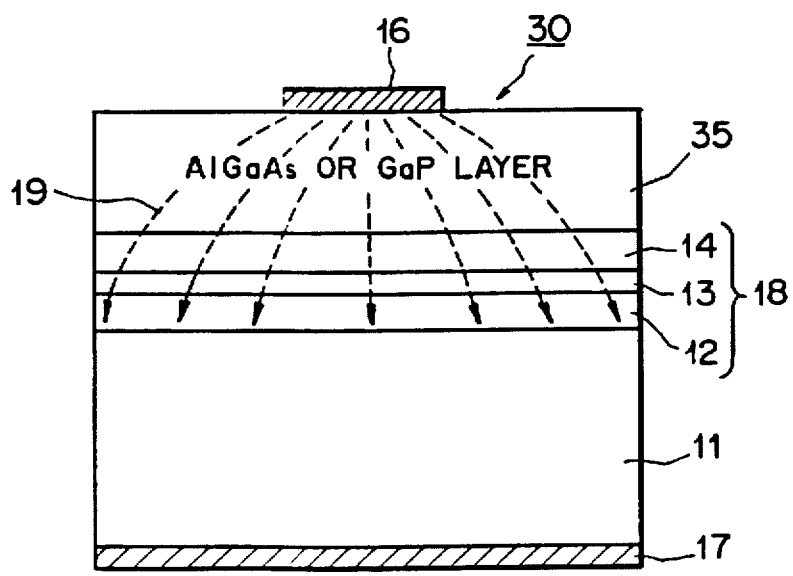
FIG. 4 is a schematic view illustrating an example of the conventional AlGaInP light-emitting device, which shows a general structure for those in Comparative Examples 1 and 2.

FIG. 1 is a schematic sectional view illustrating an example of the AlGaInP light-emitting device according to the first aspect of the present invention. In the figure, the same reference numerals as those in FIG. 4 are used to indicate the same members or similar members.

The light-emitting device 10 comprises an n-type $(Al_{0.7}Ga_{0.3})_{0.51}In_{0.49}P$ cladding layer 12 (about 1 µm in thickness), an $(Al_{0.15}Ga_{0.85})_{0.51}In_{0.49}P$ active layer 13 (about 0.6 µm in thickness), a p-type $(Al_{0.7}Ga_{0.3})_{0.51}In_{0.49}P$ cladding layer 14 (about 1 µm in thickness), and a p-type current-spreading layer 15 composed of a p-type $Al_{0.7}Ga_{0.3}As$ layer 15a (about 3 µm in thickness) and a p-type $GaAs_{0.5}P_{0.5}$ layer 15b (about 7 µm in thickness) in sequence grown on an n-type GaAs substrate 11, and further an upper surface electrode 16 mounted on the p-type $GaAs_{0.5}P_{0.5}$ layer 15b and a lower surface electrode 17 mounted on the lower surface of the n-type GaAs substrate.

EXAMPLE 2

Another AlGaInP light-emitting device 20 according to a second aspect of the present invention was produced by the same way adopted in Example 1.

Figure 2:
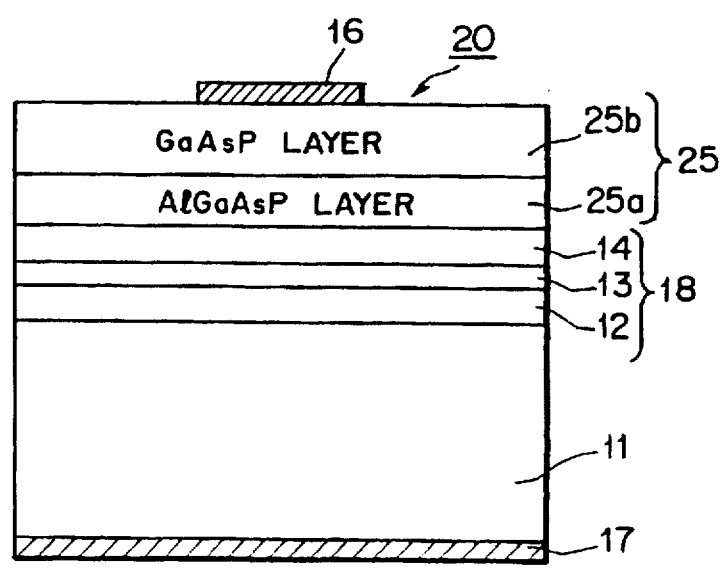
FIG. 2 is a schematic sectional view illustrating an example of the AlGaInP light-emitting device according to a second aspect of the present invention.

FIG. 2 is a schematic sectional view illustrating an example of the AlGaInP light-emitting device according to the second aspect of the present invention. In the figure, the same reference numerals as those in FIG. 4 are used to indicate the same members or similar members.

The light-emitting device 20 comprises an n-type $(Al_{0.7}Ga_{0.3})_{0.51}In_{0.49}P$ cladding layer 12 (about 1 µm in thickness), an $(Al_{0.15}Ga_{0.85})_{0.51}In_{0.49}P$ active layer 13 (about 0.6 µm in thickness), a p-type $(Al_{0.7}Ga_{0.3})_{0.51}In_{0.49}P$ cladding layer 14 (about 1 µm in thickness), and a p-type current-spreading layer 25 composed of a p-type $Al_{0.7}Ga_{0.3}As_{0.97}P_{0.03}$ layer 25a (about 3 µm in thickness) and a p-type $GaAs_{0.5}P_{0.5}$ layer 25b (about 7 µm in thickness) in sequence grown on an n-type GaAs substrate 11, and further an upper surface electrode 16 mounted on the p-type $GaAs_{0.5}P_{0.5}$ layer 25b and a lower surface electrode 17 mounted on the lower surface of the n-type GaAs substrate.

Table 1 shows evaluated characteristics of the respective AlGaInP devices of Examples 1 and 2 in comparison with those of AlGaInP light-emitting devices of the conventional structures as comparative examples 1 and 2.

The AlGaInP light-emitting devices as comparative examples 1 and 2 are those of conventional structures as shown in FIG. 4 and they are same as those of Examples with exceptions that the p-type current-spreading layers 35 are respectively composed of a p-type $Al_{0.7}Ga_{0.3}As$ layer (about 10 μm in thickness) and a p-type GaP layer (about 10 μm in thickness).

As seen clearly from Table 1, the AlGaInP light-emitting devices of the examples 1 and 2 have been proved of higher efficiency thereof by the evidence appeared in the table showing that those of the examples are superior to those of the comparative examples 1 and 2, which are conventional AlGaInP light-emitting devices, in higher luminance by a light-emission and negligible time-passage reduction of luminance by a light-emission.

In more detail, in the case that the current-emitting layer is composed of a $Al_{0.7}Ga_{0.3}As$ layer only as in the comparative example 1, even though the initial luminance by a light-emitting is high at 100 in a relative value due to a good matching in lattice to $(Al_BGa_{1-B})_{0.51}In_{0.49}P$ which composes the light-emitting region, the luminance by a light-emission after a long time-passage of operation is reduced to 66% of the initial value (hereafter referred to as a time-passage reduction ratio of luminance and the definition will be given later), because the current-spreading layer is subject to the oxidation.

On the other hand, in the case that the current-spreading layer is composed of a single GaP layer as in the comparative example 2, the initial luminance by light-emission is low at 83 in the relative value and the time-passage reduction ratio of luminance is also low at 88%, because the dislocations and internal stresses present in the interface between the light-emitting region composed of $(Al_BGa_{1-B})_{0.51}In_{0.49}P$ and the GaP current-spreading layer which are caused by the higher mismatching in lattice between them, exerts the influences upon the AlGaInP active layer.

In the examples 1 and 2, in contrast with the comparative examples 1 and 2, the initial luminances by light-emitting are higher respectively at 100 and 107 and the time-passage reduction ratios of luminance are better at 98%. Therefore, it is understood that the effect of the present invention to compose a current-spreading layer of the two sub-layers is distinctive over that of the prior art.

TABLE 1

| | Material of Current-Spreading Layer | Luminance in Relative Value | Time-Passage Reduction Ratio of Luminance in % |
|---|---|---|---|
| Example 1 | $GaAs_{0.5}P_{0.5}/Al_{0.7}Ga_{0.3}As$ | 100 | 98 |
| Example 2 | $GaAs_{0.5}P_{0.5}/Al_{0.7}Ga_{0.3}As_{0.97}P_{0.03}$ | 107 | 98 |
| Comp. Example 1 | $Al_{0.7}Ga_{0.3}As$ | 100 | 66 |
| Comp. Example 2 | GaP | 83 | 88 |

In Table 1, each of the data of evaluation is the average of the measurements from a hundred samples taken up in such a manner that 10 epitaxial wafers are produced in each batch of the experiments and then 10 light-emitting devices are fabricated on part of each of the epitaxial wafers.

The time-passage reduction ratio of luminance in % is defined as $(I/I_0)\times 100$, where $I_0$ is the initial value of luminance determined relatively and I is the magnitude of luminance, which is determined in the same way as the initial value, after a time-passage of 1000 hours operation at an applied current of 50 mA in DC under conditions of a temperature of 85° C. and a humidity of 85%.

The measurement of a luminance is made at a current of 20 mA.

As explained above, according to the present invention, since there are provided a current-spreading layer composed of two layers, $Al_wGa_{1-w}As$ or $Al_wGa_{1-w}As_{1-u}P_u$ as one of the two layers, both of which both well matches in lattice to $(Al_BGa_{1-B})_{0.51}In_{0.49}P$ as a material of a light-emitting region, and $GaAs_{1-v}P_v$ as the other of the two layers, that is harder to be oxidized and is formed either on the $Al_wGa_{1-w}As$ or on the $Al_wGa_{1-w}As_{1-u}P_u$ layer, it is possible to obtain an AlGaInP light-emitting device with a longer life and higher reliability which does not show a deterioration in characteristics relating to a light-emission even after a long time-passage of operation.

We claim:

1. An AlGaInP light-emitting device comprising a light-emitting region composed of an AlGaInP double-heterojunction structure formed on a GaAs substrate and a current-spreading layer formed on the light-emitting region, characterized in that the current-spreading layer comprises two layers of an $Al_wGa_{1-w}As$ layer and a $GaAs_{1-v}P_v$ layer formed on the $Al_wGa_{1-w}As$ layer both having energy band gaps of direct type: $E^\Gamma_g$ larger than the energy of a photon emitted from an $(Al_yGa_{1-y})_{0.51}In_{0.49}P$ active layer of the light-emitting region; wherein a GaP mixed-crystal ratio v of the $GaAs_{1-v}P_v$ layer is a value that satisfies a relation of $0.4 \leq v < 0.8$.

2. An AlGaInP light-emitting device according to claim 1, characterized in that an Al composition y of the $(Al_yGa_{1-y})_{0.51}In_{0.49}P$ active layer is a value that satisfies a relation of $0 \leq y \leq 0.7$.

3. An AlGaInP light-emitting device according to claim 1, characterized in that an AlAs mixed-crystal ratio w of the $Al_wGa_{1-w}As$ layer is a value that satisfies a relation of $0.45 \leq w < 1$.

4. An AlGaInP light-emitting device according to claim 1, characterized in that a total thickness of the current-spreading layer is 5 μm or more.

5. An AlGaInP light-emitting device according to claim 2, characterized in that an AlAs mixed-crystal ratio w of the $Al_wGa_{1-w}As$ layer is a value that satisfies a relation of $0.45 \leq w < 1$.

6. An AlGaInP light-emitting device according to claim 2, characterized in that a total thickness of the current-spreading layer is 5 μm or more.

7. An AlGaInP light-emitting device according to claim 3, characterized in that a total thickness of the current-spreading layer is 5 μm or more.

8. An AlGaInP light-emitting device according to claim 5, characterized in that a total thickness of the current-spreading layer is 5 μm or more.

9. An AlGaInP light-emitting device comprising a light-emitting region composed of an AlGaInP double-heterojunction structure formed on a GaAs substrate and a current-spreading layer formed on the light-emitting region, characterized in that the current-spreading layer comprises two layers of an $Al_wGa_{1-w}As_{1-u}P_u$ layer and a $GaAs_{1-v}P_v$ layer formed on the $Al_wGa_{1-w}As_{1-u}P_u$ layer both having energy band gaps of direct type: $E^\Gamma_g$ larger than the energy of a photon emitted from an $(Al_wGa_{1-y})_{0.51}In_{0.49}P$ active layer of the light emitting region wherein a GaP mixed-crystal ratio v of the $GaAs_{1-v}P_v$ layer is a value that satisfies a relation of $0.4 \leq v < 0.8$.

10. An AlGaInP light-emitting device according to claim 9, characterized in that the Al composition y of the $(Al_yGa_{1-y})_{0.51}In_{0.49}P$ active layer is a value that satisfies a relation of $0 \leq y \leq 0.7$.

11. An AlGaInP light-emitting device according to claim 9, characterized in that an Al composition w and P composition u of the $Al_wGa_{1-w}As_{1-u}P_u$ layer are values that respectively satisfy relations of $0.45 \leq w < 1$ and $0 < u \leq 0.08$.

12. An AlGaInP light-emitting device according to claim 9, characterized in that a total thickness of the current-spreading layer is 5 μm or more.

13. An AlGaInP light-emitting device according to claim 10, characterized in that an Al composition w and P composition u of the $Al_wGa_{1-w}As_{1-u}P_u$ layer are values that respectively satisfy relations of $0.45 \leq w < 1$ and $0 < u \leq 0.08$.

14. An AlGaInP light-emitting device according to claim 10, characterized in that a total thickness of the current-spreading layer is 5 μm or more.

15. An AlGaInP light-emitting device according to claim 11, characterized in that a total thickness of the current-spreading layer is 5 μm or more.

16. An AlGaInP light-emitting device according to claim 13, characterized in that a total thickness of the current-spreading layer is 5 μm or more.

* * * * *